United States Patent [19]
Voorman et al.

[11] Patent Number: 5,668,676
[45] Date of Patent: Sep. 16, 1997

[54] MAGNETIC HEAD WRITE AMPLIFIER INCLUDING CURRENT MIRRORS AND SWITCHABLE CURRENT SOURCES

[75] Inventors: Johannes O. Voorman; Hendrik J. Pothast; Ho W. Wong-Lam, all of Eindhoven, Netherlands

[73] Assignee: U.S. Philips Corporation, New York, N.Y.

[21] Appl. No.: 489,191

[22] Filed: Jun. 9, 1995

[30] Foreign Application Priority Data

Jun. 10, 1994 [EP] European Pat. Off. .............. 94201660

[51] Int. Cl.$^6$ ........................................................ G11B 5/09
[52] U.S. Cl. .............................. 360/46; 330/146; 327/53; 327/55; 327/66
[58] Field of Search ........................... 330/146, 288; 327/53, 54, 55, 65, 66, 67, 563; 360/48, 68, 46; 326/27; 323/315, 316

[56] References Cited

U.S. PATENT DOCUMENTS

| | | | |
|---|---|---|---|
| 4,551,772 | 11/1985 | Sliger | 360/46 |
| 5,282,094 | 1/1994 | Ngo | 360/46 |
| 5,287,231 | 2/1994 | Shier et al. | 360/68 |
| 5,296,975 | 3/1994 | Contreras et al. | 360/46 |
| 5,386,328 | 1/1995 | Chiou et al. | 360/68 |

*Primary Examiner*—Aristotelis M. Psitos
*Assistant Examiner*—Patrick Wamsley

[57] ABSTRACT

An apparatus for recording on a magnetic record carrier includes a write amplifier comprising four current mirrors which are turned on two at a time by two switchable floating current sources connected between the input terminals of the current mirrors in order to produce a write current of alternating polarity through a write head. The high impedance at the terminals of the write head enables the common-mode voltage across the write head to be fixed at any desired voltage value by means of a common-mode circuit. The symmetrical structure further enables the parasitic capacitances at the write terminals to be neutralized by means of neutralizing capacitors.

14 Claims, 7 Drawing Sheets

MAGNETIC HEAD WRITE AMPLIFIER INCLUDING CURRENT MIRRORS AND SWITCHABLE CURRENT SOURCES

BACKGROUND OF THE INVENTION

This invention relates to an arrangement for recording an information signal on a magnetic record carrier, comprising a write head for recording information on the record carrier, and a write amplifier for driving the write head in response to the information signal, the write amplifier comprising:

a first write terminal, and a second write terminal, which are coupled to the write head;

a first supply terminal and a second supply terminal for the connection of a supply voltage for the write amplifier;

a first current mirror having a first current input terminal, a first current output terminal coupled to the first write terminal, and a first common current terminal connected to the first supply terminal;

a second current mirror having a second current input terminal, a second current output terminal coupled to the second write terminal, and a second common current terminal connected to the first supply terminal; and current switching means for establishing a current path between the first current output terminal and the second supply terminal via the first write terminal and the second write terminal for a first value of the information signal and for establishing a current path between the second current output terminal and the second supply terminal via the first write terminal and the second write terminal for a second value of the information signal.

The invention also relates to a write amplifier for use in such an arrangement.

Such an arrangement and write amplifier are known from U.S. Pat. No. 5,282,094, FIG. 1. Write amplifiers having inductive write heads are used, inter alia, in hard disk drives for the storage of digital information signals, the polarity of the write current through the write head being reversed in response to the bit pattern of the information signal. In the known arrangement polarity reversal is effected with current switching means which establish a low-impedance connection between one of the write terminals and the second supply terminal. The other write terminal is then connected to the high-impedance current output terminal of the first or the second current mirror. As a result, the common-mode voltage across the write head does not have a fixed value and depends on the number of ones or zeros of the preceding bit pattern of the information signal. Consequently, the following bit change is influenced by the common-mode voltage just before the change, which may give rise to bit-pattern-dependent signal distortion. Moreover, the fluctuating common-mode voltage may produce crosstalk to other sensitive circuits. These problems limit the bit rate of the information signal to be recorded.

SUMMARY OF THE INVENTION

It is one of the objects of the invention to provide an arrangement having a write amplifier whose structure makes it more suitable for high bit rates. To this end, in accordance with the invention, the arrangement of the type defined in the opening paragraph is characterized in that the current switching means comprise:

a third current mirror having a third current input terminal, a third current output terminal coupled to the first write terminal, and a third common current terminal connected to the second supply terminal;

a fourth current mirror having a fourth current input terminal, a fourth current output terminal coupled to the second write terminal, and a fourth common current terminal connected to the second supply terminal;

a first switchable current source connected between the first current input terminal and the fourth current input terminal for supplying a first current for a first value of the information signal; and a second switchable current source connected between the second current input terminal and the third current input terminal for supplying a second current for the second value of the information signal.

The write head is now connected between the high-impedance outputs of four current mirrors, which are turned on two at a time by means of the switchable current sources. When the first switchable current source conducts, a current will flow through the write head from the first supply terminal to the second supply terminal via the first and the fourth current mirror. When the second switchable current, source conducts, an opposite current will flow through the write head from the first supply terminal to the second supply terminal via the second and the third current mirror. Since the write head is connected between the high-impedance current output terminals of the four current mirrors the common-mode voltage can be fixed as required by additional measures, preferably at half the supply voltage, and can be rendered independent of the bit pattern. The current mirrors then saturate only during the peaks of the write head voltage and no clamping circuits are needed to preclude oversaturation of the output transistors of the write amplifier.

A first-embodiment of an arrangement in accordance with the invention with common-mode control is characterized in that the write amplifier further comprises: a first resistor connected between the first write terminal and a first node, a second resistor connected between the first node and the second write terminal, a third resistor connected between the first supply terminal and the first node, and a fourth resistor connected between the second supply terminal and the first node. The first and the second resistor are arranged in series across the write head and also form damping resistors for the write head. The common-mode voltage across the write head is equal to the voltage on the first node, which forms the center tap of the first and the second resistor, and is fixed by means of a simple voltage divider arranged across the power supply and comprising the third and the fourth resistor. The fixation of the common-mode voltage improves as the impedance of the voltage divider is reduced. Too low an impedance is to be avoided in view of the increasing dissipation in the voltage divider.

In order to reduce the dissipation, a second embodiment of the arrangement in accordance with the invention is characterized in that the write amplifier further comprises: a first resistor connected between the first write terminal and a first node, a second resistor connected between the first node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a third resistor connected between the first supply terminal and the second main electrode of the second transistor, a third transistor of a second conductivity type having a control electrode, a first main electrode connected to the first node and a second main electrode coupled to the second supply terminal, a fourth transistor of the second conductivity type having a control electrode connected to the control electrode of the third transistor, a first main electrode connected to the first main electrode of the second transistor and a second main electrode connected to the control electrode of the fourth transistor, and a fourth resistor connected between the second supply terminal and the second main electrode of the fourth transistor.

The first and the second transistor operate in class A/B and produce at the first node a low impedance, which can be realized with comparatively larger third and fourth resistors.

It is to be noted that the transistors may be bipolar transistors or unipolar MOS transistors. The control electrode, the first main electrode and the second main electrode correspond to the base, the emitter and the collector, respectively, for a bipolar transistor and to the gate, the source and the drain, respectively, for a unipolar transistor.

Only two of the four current mirrors are active at the same time. The turn-on of the current mirrors can be speeded up by allowing a quiescent current to flow through the four current mirrors. Then, less current is needed to charge and discharge the stray capacitances in the current mirrors. A third embodiment of an arrangement with common mode control in accordance with the invention is characterized in that the write amplifier further comprises:

a first resistor connected between the first write terminal and a first node, a second resistor connected between the first node and the second write terminal, a third resistor connected between the first write terminal and a second node, a fourth resistor connected between the second node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a fifth resistor connected between the first supply terminal and the second main electrode of the second transistor, a third transistor of the first conductivity type having a control electrode connected to the control electrode of the first transistor, a first main electrode connected to the first node and a second main electrode coupled to the second supply terminal, a fourth transistor of a second conductivity type having a control electrode, a first main electrode connected to the first node and a second main electrode coupled to one of the third current input terminal and the fourth current input terminal, a fifth transistor of the second conductivity type having a control electrode connected to the control electrode of the fourth transistor, a first main electrode connected to the first main electrode of the second transistor and a second main electrode connected to the control electrode of the fifth transistor, a sixth resistor connected between the second supply terminal and the second main electrode of the fifth transistor, a sixth transistor of the second conductivity type having a control electrode connected to the control electrode of the fourth transistor, a first main electrode connected to the second node and a second main electrode coupled to the other one of the third current the quiescent current input terminal and the fourth current input terminal.

This embodiment advantageously combines the common-mode control and the quiescent current setting for the four current mirrors. Now the bias currents through the four transistors connected to the first and the second node are not drained to the supply terminals but flow into the respective current input terminals of the four current mirrors and serve as quiescent currents for the current mirrors. The damping resistance is made up of two series chains of two resistors having a center tap at the first and the second node. The current mirrors reduce the apparent resistance of the damping resistors for common-mode signals by a factor determined by the current gain of the current mirrors. The individual series chains function as emitter degeneration resistors for the first and the fourth transistor, whose emitters are connected to the first node, and for the third and the sixth transistor, whose emitters are connected to the second node. This reduces the influence of a possible mismatch between the first and the third transistor and between the fourth and the sixth transistor. An alternative embodiment is characterized in that the second node is connected to the first node.

The afore-mentioned first and second switchable current sources determine how much and in which direction current flows through the write head. In this respect an embodiment of the arrangement in accordance with the invention is characterized in that the first and the second switchable current source comprise:

a seventh transistor of a first conductivity type having a control electrode connected to a third node, a first main electrode, and a second main electrode coupled to the first current input terminal, an eighth transistor of the first conductivity type having a control electrode connected to the control electrode of the seventh transistor, a first main electrode, and a second main electrode coupled to the first supply terminal, a ninth transistor of a second conductivity type having a control electrode connected to a fourth node, a first main electrode connected to the first main electrode of the seventh transistor, and a second main electrode coupled to the fourth current input terminal, a diode-connected tenth transistor of the second conductivity type having a first main electrode connected to the first main electrode of the eighth transistor and having a control electrode and second main electrode connected to the fourth node, a bias current source coupled to the fourth node to supply a bias current to the fourth node, an eleventh transistor of the first conductivity type having a control electrode connected to a fifth node, a first main electrode, and a second main electrode coupled to the second current input terminal, a twelfth transistor of the first conductivity type having a control electrode connected to the control electrode of the eleventh transistor, a first main electrode, and a second main electrode coupled to the first supply terminal, and a thirteenth transistor of the second conductivity type having a control electrode connected to the fourth node, a first main electrode connected to the first main electrode of the transistor, and a second main electrode coupled to the third current input terminal.

The bias current source determines the magnitude of the write current through the write head. The bias current is drained to the power supply via the eighth transistor or via the twelfth transistor, depending on the value of the information signal. The seventh, the ninth and the tenth transistor form a translinear loop with the eighth transistor, and the eleventh, the thirteenth and the tenth transistor form a translinear loop with the twelfth transistor. Conduction of the eighth or the twelfth transistor now results in an amplified current flowing from the first current input terminal to the third current input terminal via the seventh and the ninth transistor or from the second current input terminal to the fourth current input terminal. The d.c. level of the information signal at the third and the fifth node, applied via a suitable buffer, if required, is fully isolated from the d.c. level at the current input terminals. The switchable current sources thus form floating switchable current sources whose switching signals have d.c. levels which can be chosen freely.

The buffers for the information signal can be emitter followers or source followers. The quiescent current supply for these followers can be combined advantageously with the current supply for the switchable current sources. To this end, an embodiment of the arrangement is further characterized in that the first and the second switchable current source further comprise:

- a fourteenth transistor of the first conductivity type having a control electrode for receiving the information signal, a first main electrode connected to the third node and a second main electrode coupled to the first supply terminal,
- a fifteenth transistor of the first conductivity type having a control electrode for receiving the information signal, a first main electrode connected to the fifth node and a second main electrode coupled to the first supply terminal,
- a sixteenth transistor of the first conductivity type having a control electrode connected to the control electrode of the eighth transistor, a first main electrode connected to the first main electrode of the eighth transistor, and a second main electrode coupled to the fifth node, a seventeenth transistor of the first conductivity type having a control electrode connected to the control electrode of the twelfth transistor, a first main electrode connected to the first main electrode of the twelfth transistor, and a second main electrode coupled to the third node, the second main electrode of the eighth transistor being connected to the third node and the second main electrode of the twelfth transistor being connected to the fifth node.

The fourteenth and the fifteenth transistor operate as signal followers and buffer the information signal. The currents through these transistors now flow to the fourth node through the eighth and the twelfth transistor, respectively. The sixteenth and the seventeenth transistor ensure that always one half of the bias current from the bias current source flows through one signal follower and the other half through the other signal follower.

Parasitic capacitances at the first and the second write terminal caused by the transistors of the write amplifier and by the wiring and construction of the write head limit the bit rate of the information signal to be recorded. This is because for high frequencies the write current is shunted by the parasitic capacitances. In order to reduce the effect of these parasitic capacitances an embodiment of the arrangement in accordance with the invention is characterised in that the write amplifier further comprises at least one of: a first capacitor connected between the first current input terminal and the second current output terminal, a second capacitor connected between the second current input terminal and the first current output terminal, a third capacitor connected between the third current input terminal and the fourth current output terminal, and a fourth capacitor connected between the fourth current input terminal and the third current output terminal.

The first to the fourth capacitor neutralize the parasitic capacitances by injecting opposite capacitive currents into the first and the second write terminal. Preferably, the capacitors are used in pairs, i.e. the first together with the second and/or the third together with the fourth capacitor, in order not to disturb the symmetry of the arrangement and not to load the common mode.

The four current mirrors may be of any suitable type. For a maximal swing of the write amplifier a preferred embodiment of the arrangement in accordance with the invention is characterized in that the third current mirror and the fourth current mirror each comprise a diode-connected input transistor of a first conductivity type having a control electrode and a second main electrode connected to the third and the fourth current input terminal, respectively, and having a first main electrode coupled to the second supply terminal, and an output transistor of the first conductivity type having a control electrode connected to the control electrode of the relevant input transistor, a first main electrode coupled to the second supply terminal, and a second main electrode connected to the third and the fourth current output terminal, and in that the first current mirror and the second current mirror each comprise a diode-connected input transistor of a second conductivity type having a control electrode and a second main electrode connected to the first and the second current input terminal, respectively, and having a first main electrode coupled to the first supply terminal, and an output transistor of the second conductivity type having a control electrode connected to the control electrode of the relevant input transistor, a first main electrode coupled to the first supply terminal, and a second main electrode connected to the first and the second current output terminal.

Current mirrors thus implemented produce a minimal voltage loss and allow an output swing up to nearly the supply voltage. Moreover, they have basically a single pole in the current transfer function, so that no additional ringing of the waveform is produced. Ringing may lead to intersymbol interference.

This embodiment may be characterized further in that the first main electrodes of the input transistors and output transistors of the first and the second current mirror are connected to the first supply terminal via resistors, and the first main electrodes of the input transistors and output transistors of the third and the fourth current mirror are connected to the second supply terminal via resistors. The resistors provide a better matching between the current mirror transistors and improve the temperature stability.

BRIEF DESCRIPTION OF THE DRAWINGS

These and other aspects of the invention will be described and elucidated with reference to the accompanying drawings, in which.

In these Figures like elements bear the same reference symbols.

DESCRIPTION OF THE PREFERRED EMBODIMENTS

Figure 1:
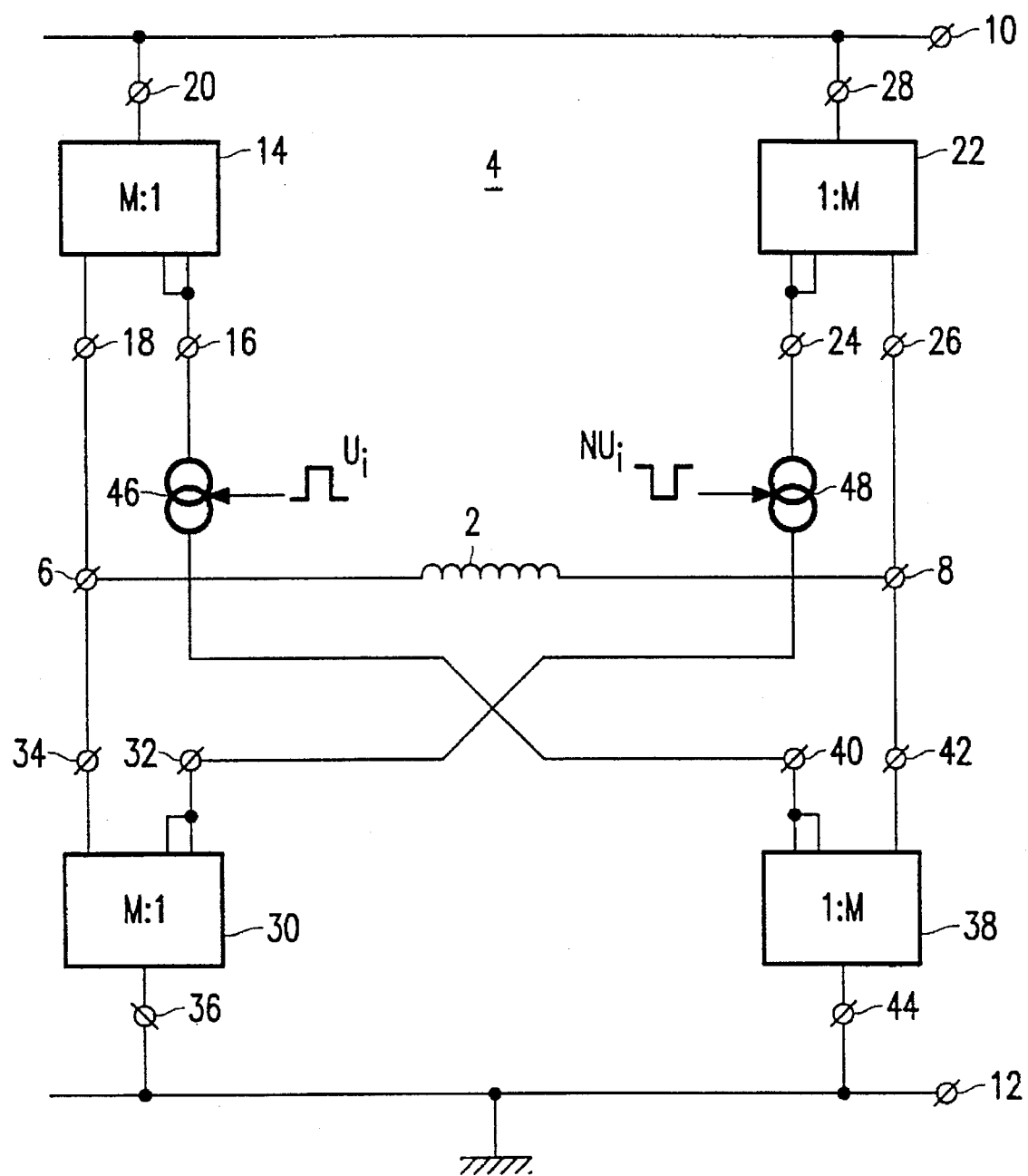
FIG. 1 shows a circuit diagram of an arrangement for recording an information signal on a magnetic record carrier in accordance with the invention.

FIG. 1 shows the basic structure of an arrangement for recording an information signal on a magnetic record carrier in accordance with the invention. The arrangement comprises a write head 2 for recording information on the record carrier (not shown) and a write amplifier 4 for driving the write head 2 in response to the information signal. The write amplifier has a first write terminal 6 and a second write terminal 8, which are coupled to the write head 2 to supply a write current. A first supply terminal 10 and a second supply terminal 12 serve for connection of a supply voltage for the write amplifier. In the present case the second supply terminal 12 is connected to signal ground. The amplifier 4 comprises a first current mirror 14 having a first current input terminal 16, a first current output terminal 18 coupled to the first write terminal 6, and a first common current terminal 20 connected to the first supply terminal 10; a second current mirror 22 having a second current input terminal 24, a second current output terminal 26 coupled to the second write terminal 8, and a second common current terminal 28 connected to the first supply terminal 10; a third current mirror 30 having a third current input terminal 32, a third current output terminal 34 coupled to the first write terminal 6, and a third common current terminal 36 connected to the second supply terminal 12; a fourth current mirror 38 having a fourth current input terminal 40, a fourth current output terminal 42 coupled to the second write terminal 8, and a fourth common current terminal 44 connected to the second supply terminal 12. A first switchable current source 46 is connected between the first current input terminal 16 and the fourth current input terminal 40. The first switchable current source supplies a first current for a first value of the information signal $U_i$ and is currentless for a second value of the information signal $U_i$. The information signal $U_i$ may be, for example, the binary data signal for a disk drive or another magnetic storage medium. A second switchable current source 48 is connected between the second current input terminal 24 and the third current input terminal 32. The second switchable current source 48 receives an inverse information signal $NU_i$ and supplies a second current if the first current is zero and the other way around.

When the first switchable current source 46 is turned on current will flow from the first supply terminal 10 to the second supply terminal 12 through the first current input terminal 16 of the first current mirror 14 and through the fourth current input terminal 40 of the fourth current mirror 38. A current which is M times as large flows in the same direction from the first current output terminal 18 of the first current mirror 14 to the fourth current output terminal 42 of the fourth current mirror 38 via the first write terminal 6, the write head 2 and the second write terminal 8. Here, M is the current mirror ratio of the current mirrors 14, 22, 30 and 38. The second switchable current source 48 is turned off, so that the second current mirror 22 and the third current mirror 30 are inoperative. Now a write current flows from the first write terminal 6 to the second write terminal 8 through the write head 2.

When the first switchable current source 46 is turned off and the second switchable current source 48 is turned on the second current mirror 22 and the third current mirror 30 are active and the other two current mirrors 14 and 38 are inactive. Now a write current flows in the opposite direction from the second write terminal 8 to the first write terminal 6 through the write head 2. It will be obvious that the first current of the first switchable current source 46 and the second current of the second switchable current source 48 should be equal in order to obtain equal write currents in both directions in the case were the current mirror ratios of the current mirrors are all equal.

Figure 2:
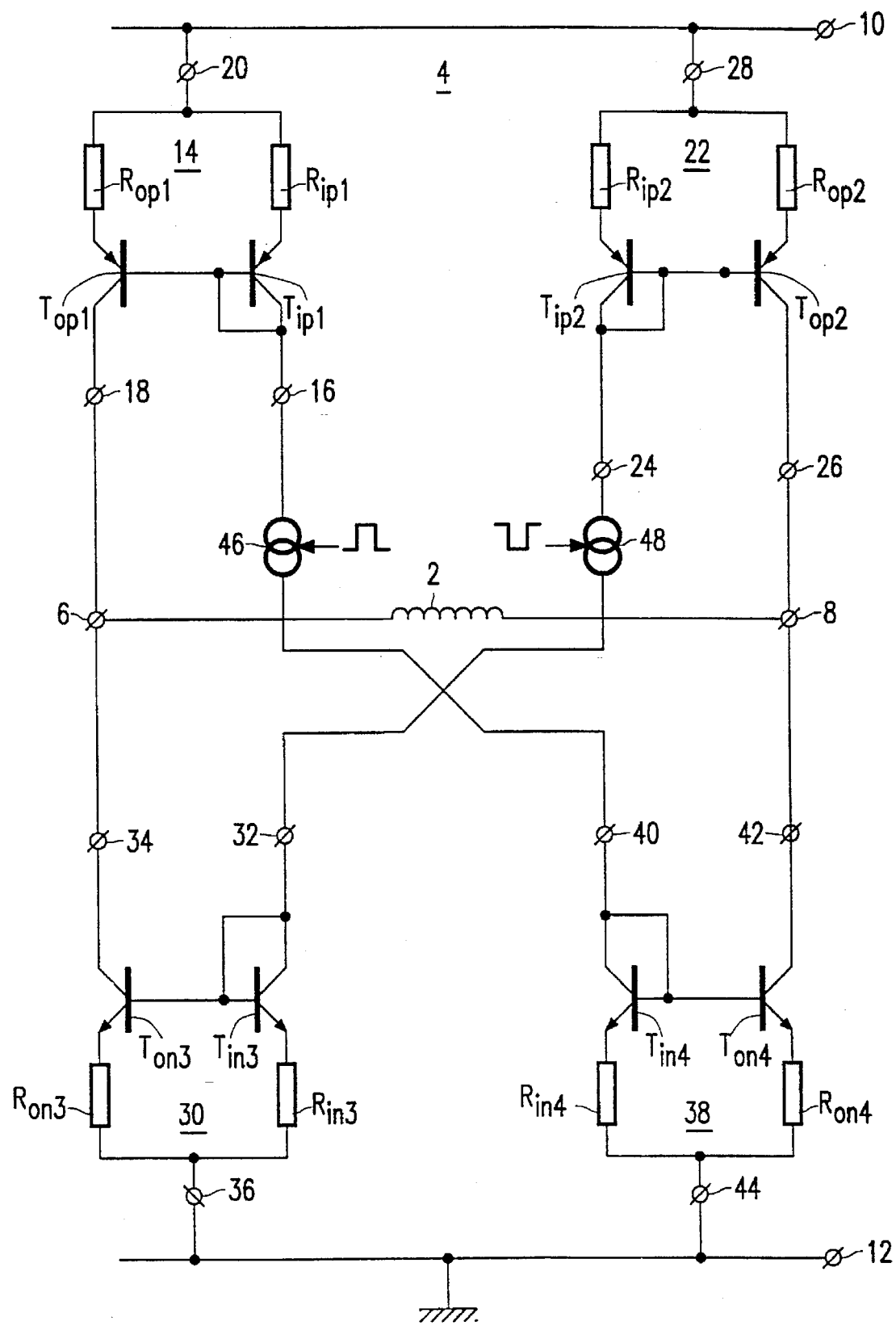
FIG. 2 is a circuit diagram of an embodiment of an arrangement for recording an information signal on a magnetic record carrier in accordance with the invention.

FIG. 2 shows an embodiment in which the first current mirror 14 and the second current mirror 22 comprise bipolar PNP transistors and the third current mirror 30 and the fourth current mirror 38 comprise bipolar NPN transistors. However, it is to be noted that in the circuit arrangements disclosed and to be disclosed bipolar transistors may be replaced wholly or partly by unipolar MOS transistors. The control electrode, the first main electrode and the second main electrode correspond to the base, the emitter and the collector, respectively, for a bipolar transistor and to the gate, the source and the drain, respectively, for a unipolar transistor. The first current mirror 14 comprises a diode-connected PNP input transistor $T_{ip1}$, having its emitter connected to the first common current terminal 20 via an optional emitter resistor $R_{ip1}$ and its collector to the first current input terminal 16, and a PNP output transistor $T_{op1}$, having its base connected to the base of the input transistor $T_{ip1}$, its emitter to the first common current terminal 20 via an optional emitter resistor $R_{op1}$ and its collector to the first current output terminal 18. The optional emitter, resistors improve the matching of the transistors and increase the thermal stability of the current mirror. The second current mirror 22 likewise comprises PNP transistors and the third current mirror 30 and the fourth current mirror 38 likewise comprise NPN transistors, the electrodes of the respective transistors being connected to the corresponding terminals of the current mirrors.

The common-mode voltage of the write head 2 is completely indeterminate and may fluctuate with the data pattern of the information signal to be recorded. This is undesirable. The common-mode voltage should preferably lie halfway between the available output swing and should be independent of the signal content of the signal to be recorded. Since the write head 2 is arranged exclusively between high-impedance outputs of current mirrors it is possible to fix the common-mode voltage with a common-mode circuit.

Figure 3:
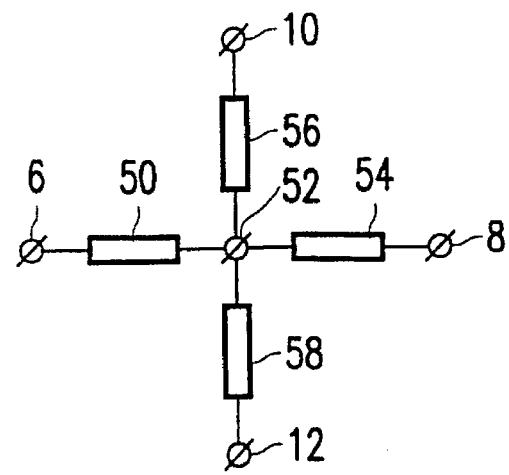
FIG. 3 shows a first common-mode circuit for use in an arrangement in accordance with the invention.

FIG. 3 shows a simple common-mode circuit. A series arrangement of a first resistor 50 connected between the first write terminal 6 and a first node 52, a second resistor 54 connected between the first node 52 and the second write terminal 8, a third resistor 56 connected between the first supply terminal 10 and the first node 52, and a fourth resistor 58 connected between the second supply terminal 12 and the first node 52 is arranged in parallel with the write head. The resistors 50 and 54 also function as damping resistors for the write head. The impedance at the first node 52 is dictated by the resistors 56 and 58. For a correct fixation of the common-mode voltage a minimal impedance is desired. However, the resistance value of the resistors 56 and 58 cannot be chosen arbitrarily small on account of the increasing current through these resistors.

Figure 4:
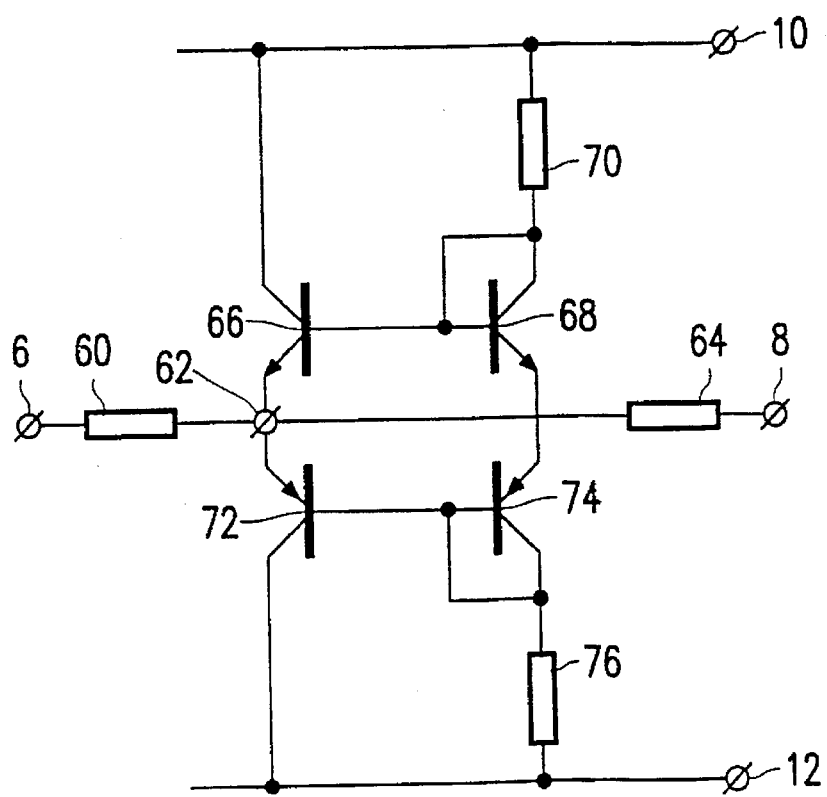
FIG. 4 shows a second common-mode circuit for use in an arrangement in accordance with the invention.

FIG. 4 shows a common-mode circuit which mitigates this problem. The circuit again comprises a first resistor 60 connected between the first write terminal 6 and a first node 62, and a second resistor 64 connected between the first node 62 and the second write terminal 8 and, in addition, it comprises a first NPN transistor 66 having its emitter connected to the first node 62 and having its collector coupled to the first supply terminal 10, a diode-connected second NPN transistor 68 having its base connected to the base of the first NPN transistor 66, a third resistor 70 connected between the first supply terminal 10 and the collector of the second NPN transistor 68, a first PNP transistor 72 having its emitter connected to the first node 62 and having its collector coupled to the second supply terminal 12, a diode-connected second PNP transistor 74 having its base connected to the base of the first transistor 72 and having its emitter connected to the emitter of the second NPN transistor 68, and a fourth resistor 76 connected between the second supply terminal 12 and the collector of the second PNP transistor 74.

The circuit operates in class A/B. Seen at the first node 62, the impedance is low, which provides a correct fixation of the common-mode voltage. The class A/B operation enables a small quiescent current to be obtained in and a large maximum current to be supplied by the first NPN transistor 66 or the first PNP transistor 72. The effective common-mode resistance is equal to Rd/4, the resistance value of both the resistor 60 and the resistor 64 being equal to Rd/2. The overall damping resistance across the write head 2 is consequently Rd.

Figure 5:
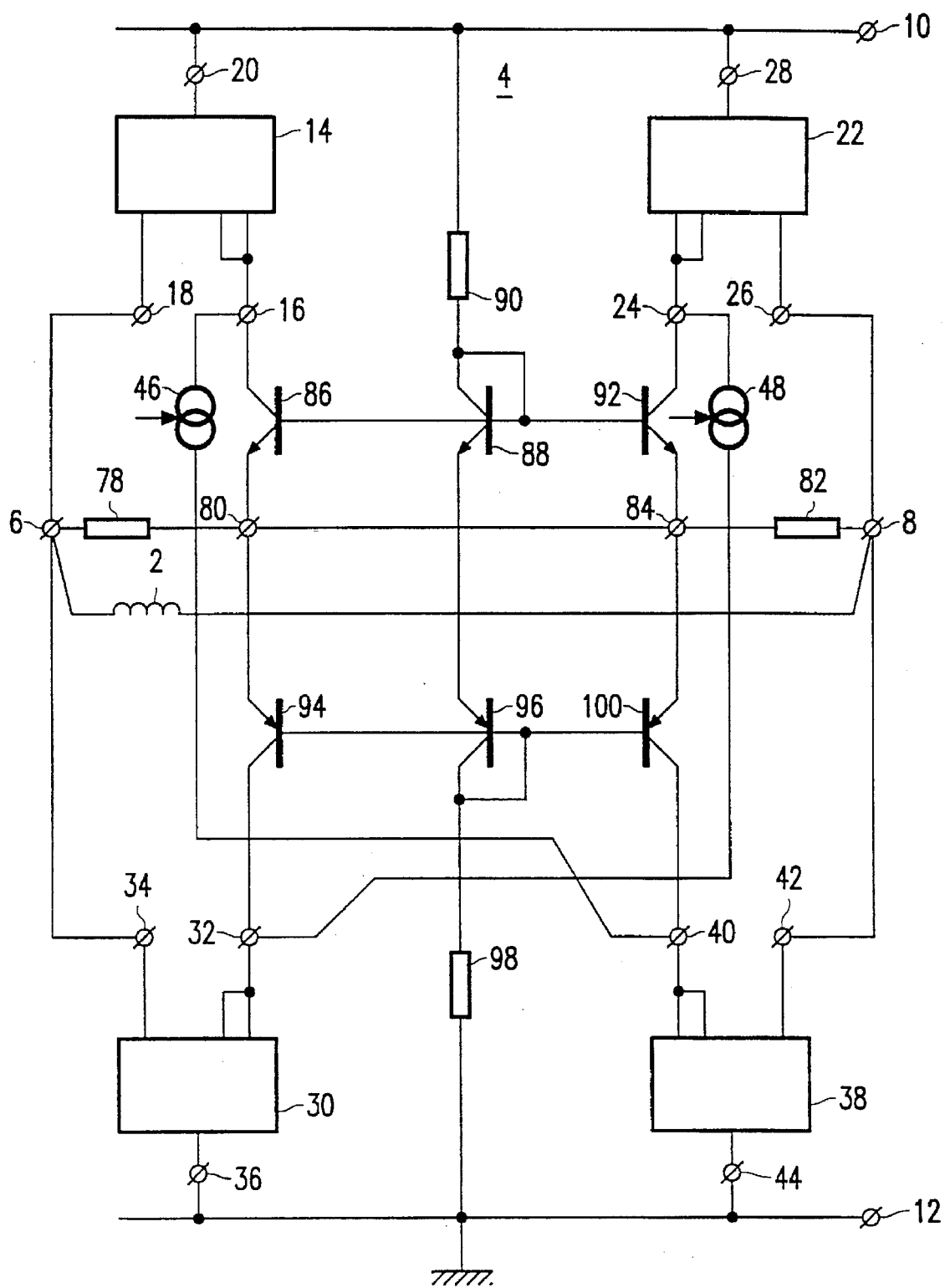
FIG. 5 shows a circuit diagram of an embodiment of an arrangement for recording an information signal on a magnetic record carrier in accordance with the invention, including a third common-mode circuit.

In order to step up the switching speed of the current mirrors in the arrangements shown in FIGS. 1 and 2 it is desirable to have a quiescent current in the current mirrors. This quiescent current setting and the common-mode circuit can be combined advantageously. FIG. 5 shows an embodiment in which this is implemented. The write amplifier 4 again comprises four current mirrors 14, 22, 30 and 38, the write head 2, the first switchable current source 46 and the second switchable current source 48 as shown in FIG. 1. The common-mode circuit comprises a first resistor 78 connected between the first write terminal 6 and a first node 80, a second resistor 82 between a second node 84 and the second write terminal 8, a first transistor 86 of the NPN type having its emitter connected to the first node 80 and having its collector coupled to the first current input terminal 16, a diode-connected second transistor 88 of the NPN type having its base connected to the base of the first transistor 86, a third resistor 90 connected between the first supply terminal 10 and the collector of the second transistor 88, and a third transistor 92 of the NPN type having its base connected to the base of the first transistor 86 and its emitter to the second node 84 and having its collector coupled to the second current input terminal 24. The common-mode circuit further comprises a fourth transistor 94 of the PNP type having its emitter connected to the first node 80 and having its collector coupled to the third current input terminal 32, a diode-connected fifth transistor 96 of the PNP type having its base connected to the base of the fourth transistor 94 and having its emitter connected to the emitter of the second transistor 88, a fourth resistor 98 connected between the second supply terminal 12 and the collector of the fifth transistor 96, and a sixth transistor 100 of the PNP type having its base connected to the base of the fourth transistor 94 and its emitter to the second node 84 and having its collector coupled to the fourth current input terminal 40. The first node 80 and the second node 84 are interconnected. The quiescent current which flows through the transistors 86 and 94 now also flows into the first current input terminal 16 of the first current mirror 14 and into the third current input terminal 32 of the third current mirror 30. The quiescent current setting for the second current mirror 22 and the fourth current mirror 38 is obtained in a similar way by means of the transistors 92 and 100. The effective common-mode resistance is equal to Rd/(4(M+1)), where Rd/2 is the resistance value of the first resistor 78 and of the second resistor 82 and M is the current mirror ratio of the current mirrors 14, 22, 30 and 38. A voltage variation at the write terminal 6 produces in the first resistor 78 a current which appears M times as large at the same write terminal 6. The apparent resistance value Rd/2 of the first resistor 78 is thus reduced by a factor (M+1). The same occurs for the second resistor 82. It is to be noted that the collector of the transistor 94 may be coupled to the fourth current input terminal 40 instead of to the third current input terminal 32 and that the collector of the transistor 100 may be coupled to the third current input terminal 32 instead of to the fourth current input terminal 40. This makes no difference for the quiescent current setting because the current in the transistors 94 and 100 is the same. If desired, instead of the transistors 94 and 100, the collectors of the transistors 86 and 92 may be connected crosswise to the current input terminal 16 and 24.

Figure 6:
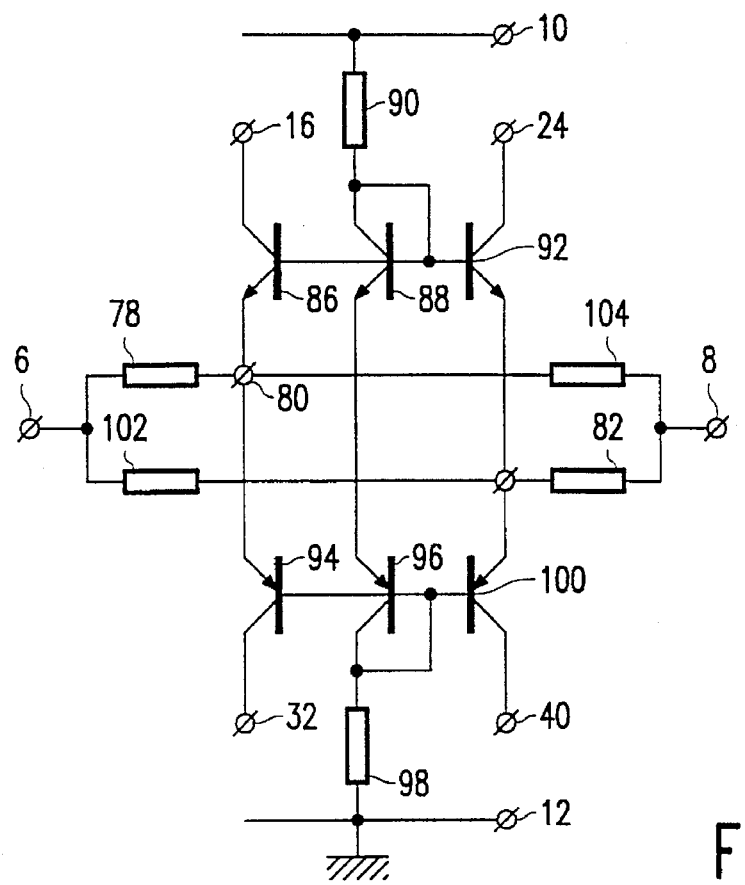
FIG. 6 shows a fourth common-mode circuit for use in an arrangement in accordance with the invention.

FIG. 6 shows an alternative solution, in which the connection between the first node 80 and the second node 84 is severed. Instead of this, a fifth resistor 102 is now connected between the write terminal 6 and the second node 84 and a sixth resistor 104 between the first node 80 and the write terminal 8. This solution can be more accurate because the transistors 86 and 92 as well as the transistors 94 and 100 now each see a separate degeneration resistor in series with their emitters. This mitigates the effect of a possible mismatch between the transistors 86 and 92 and between the transistors 94 and 100. Again, it is to be noted that the collector of the transistor 94 may be coupled to the fourth current input terminal 40 instead of to the third current input terminal 32 and that the collector of the transistor 100 may be coupled to the third current input terminal 32 instead of to the fourth current input terminal 40.

Figure 7:
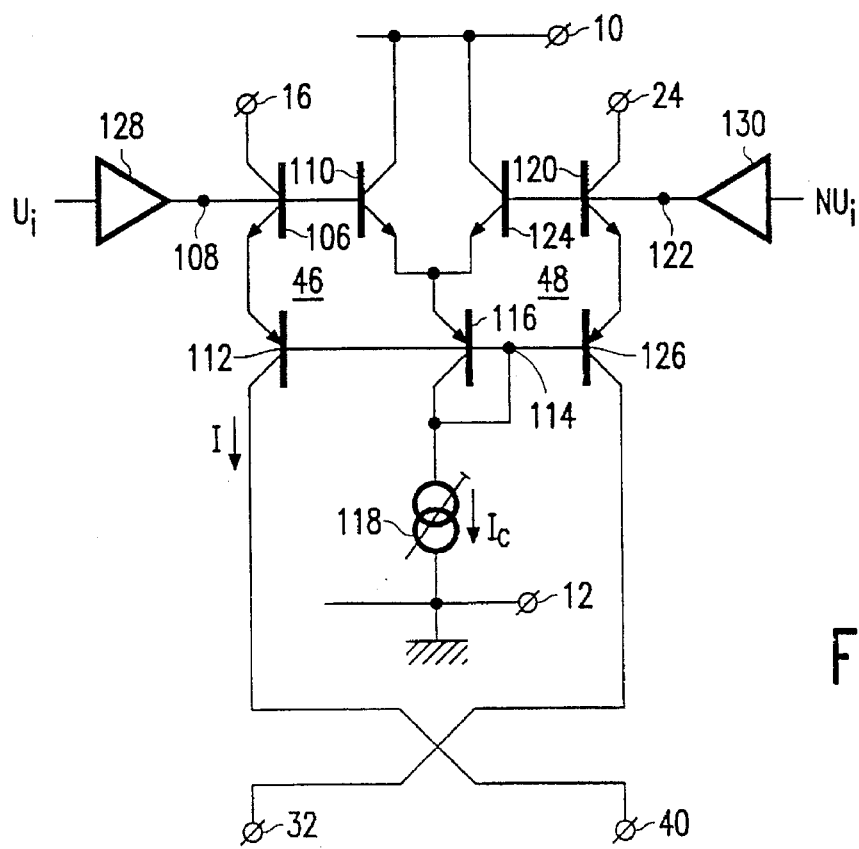
FIG. 7 shows a first implementation of switched current sources for use in an arrangement in accordance with the invention.

FIG. 7 shows a circuit diagram of an implementation of the first switchable current source 46 and the second switchable current source 48 of the arrangements shown in FIGS. 1, 2 and 5. The two switchable current sources are united in one circuit comprising the following elements. An NPN transistor 106 having its base connected to a third node 108 and having its collector coupled to the first current input terminal 16, an NPN transistor 110 having its base connected to the base of the transistor 106 and having its collector coupled to the first supply terminal 10, a PNP transistor 112 having its base connected to a fourth node 114 and its emitter to the emitter of the transistor 106 and having its collector coupled to the fourth current input terminal 40, a diode-connected PNP transistor 116 having its emitter connected to the emitter of the transistor 110 and having its base and its collector connected to the fourth node 114, a bias current source 118 coupled to the fourth node 114 to supply a bias current $I_c$ to the fourth node 114. The circuit further comprises an NPN transistor 120 having its base connected to a fifth node 122 and having its collector coupled to the second current input terminal 24, an NPN transistor 124 having its base connected to the base of the transistor 120 and having its collector coupled to the first supply terminal 10, and a PNP transistor 126 having its base connected to the fourth node 114 and its emitter to the emitter of the transistor 120 and having its collector coupled to the third current input terminal 32.

The nodes 108 and 122 are driven in phase opposition with the information signal $U_i$ and the inverse information signal $NU_i$ via buffers 128 and 130. When the voltage at the node 108 is high and the voltage at the node 122 is low the transistor 110 is conductive and the transistor 124 is cut off. The bias current $I_c$ of the bias current source 118 flows wholly through the transistor 110 via the transistor 116. The base-emitter junctions of the transistors 106, 110, 116 and 112 form a translinear loop, the sum of the base-emitter voltages of the transistors 106 and 112 being equal to the sum of the base-emitter voltages of the transistors 110 and 116. By means of the well-known formula for the relationship between the collector current and the base-emitter voltage of a transistor it is then possible to derive that the current I through the transistors 106 and 112 is equal to I=SQRT $(M*N)*I_c$, where SQRT is the root function, M the ratio between the emitter areas of the transistors 106 and 110 and N the ratio between the emitter areas of the transistors 112 and 116. As a result of this, a current I will flow between the terminals 16 and 40, whose magnitude is proportional to the current $I_c$, the proportionality factor being determined by the geometries of the transistors 106, 110, 112 and 116.

Likewise, a current will flow between the second current input terminal 24 and the third current input terminal 32 if the voltage at the node 122 is high and that at the node 108 is low. To this end, the bias current source 118 is preferably an adjustable or programmable current source, for example, an IDAC (digital-to-analog converter with current output). Since the current input terminals 16, 24, 32 and 40 are all coupled to collectors the d.c. level of the information signals $U_i$ and $NU_i$ is now isolated from the d.c. levels of the current input terminals of the current mirrors of the write amplifier. Thus, the switched current sources 46 and 48 are floating relative to the supply voltages at the first supply terminal 10 and the second supply terminal 12.

Figure 8:
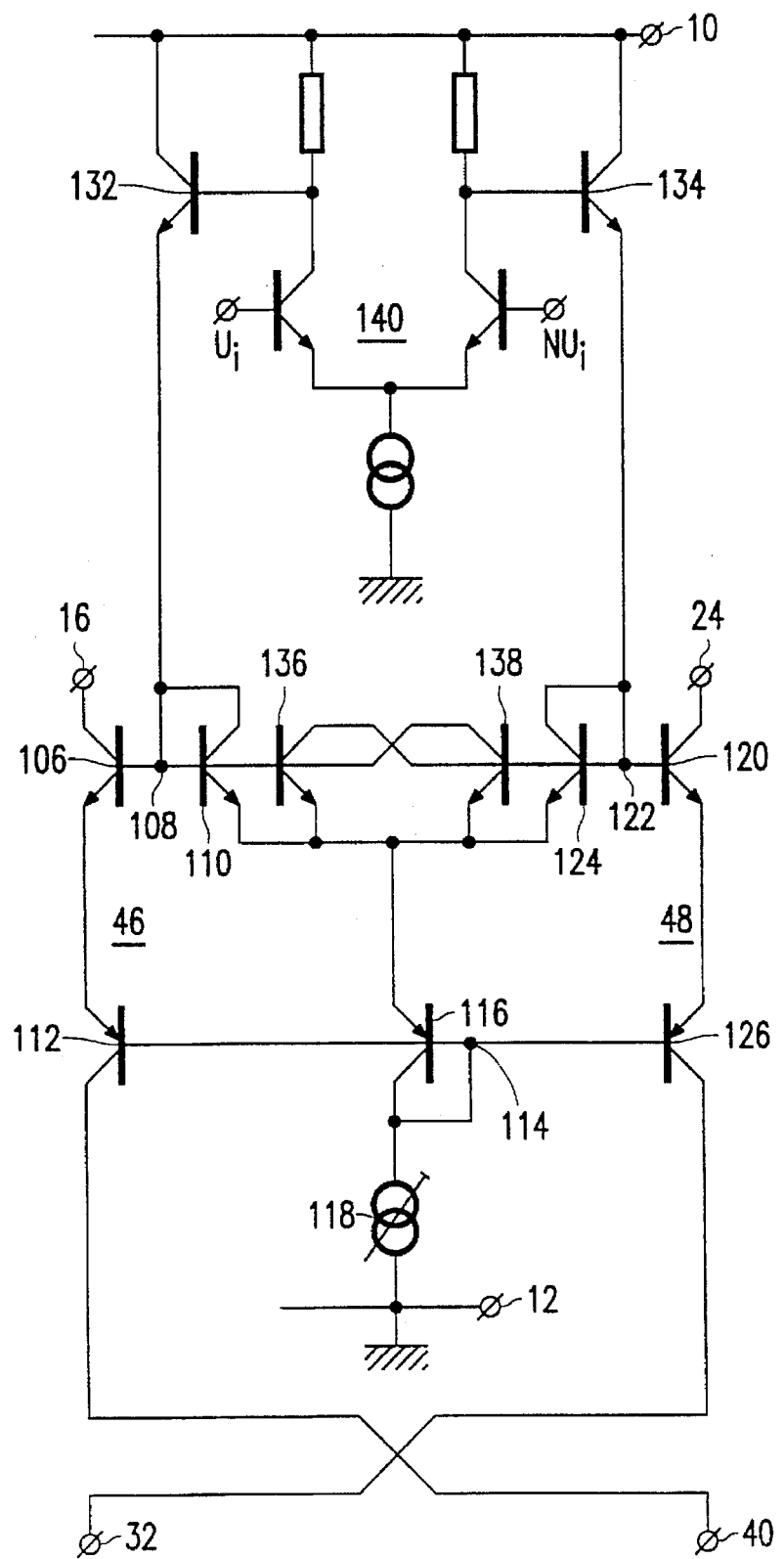
FIG. 8 shows a second implementation of switched current sources for use in an arrangement in accordance with the invention.

The buffers 128 and 130 may comprise emitter-followers with emitter current sources. However, saving current is possible by using the currents through the transistors 110 and 124 for this purpose. FIG. 8 shows how this can be realized. The buffer 128 is now an NPN emitter-follower 132 whose base receives an amplified information signal, whose emitter is connected to the third node 108 and whose collector is coupled to the first supply terminal 10. The collector of the transistor 110 is connected to the emitter of the emitter-follower 132. The buffer 130 likewise comprises an NPN emitter-follower 134 whose base receives an amplified inverse information signal, whose emitter is connected to the fifth node 122 and whose collector is coupled to the first supply terminal 10. The collector of the transistor 124 is connected to the emitter of the emitter-follower 134. The collector currents of the transistors 110 and 124 consequently also flow through the emitter-followers 132 and 134, respectively. Furthermore, there is provided an NPN transistor 136 having its base connected to the base of the transistor 110 and its emitter to the emitter of the transistor 110 and having its collector coupled to the fifth node 122, and an NPN transistor 138 having its base connected to the base of the transistor 124 and its emitter to the emitter of the transistor 124 and having its collector coupled to the third node 108. The transistors 136 and 138 ensure that the currents through the emitter-followers 132 and 134 cannot become zero if one of the transistors 110 and 124 is cut off. Thus, each of the two emitter-followers always receives half the bias current $I_c$ if the geometries of the transistors 110, 136, 138 and 124 are selected to be equal.

The bases of the emitter-followers 132 and 134 are driven, by way of example, by the transistors of a differential pair 140 whose bases are arranged to receive the complementary information signals $U_i$ and $NU_i$, which are supplied, for example, by a data flip-flop.

Figure 9:
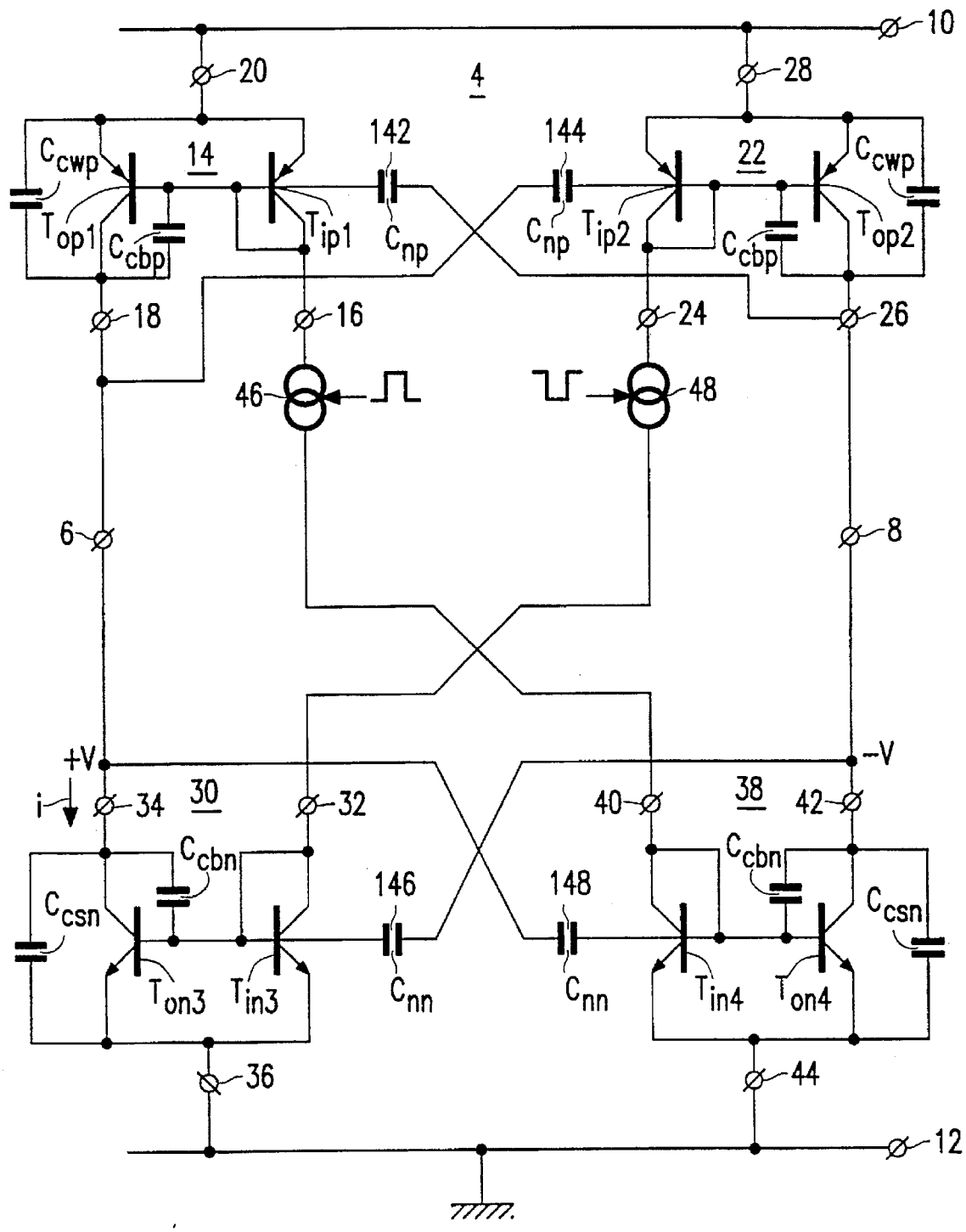
FIG. 9 shows a circuit diagram of an embodiment of an arrangement for recording an information signal on a magnetic record carrier in accordance with the invention, which arrangement includes neutralizing capacitors.

FIG. 9 again shows the arrangement of FIG. 2 but now without the write head 2 and the emitter resistors in the current mirrors. A number of parasitic capacitances are shown, i.e. one having a value $C_{cwp}$ between collector and well of the PNP output transistors $T_{op1}$ and $T_{op2}$, one having a value $C_{csn}$ between collector and substrate of the NPN output transistors $T_{on3}$ and $T_{on4}$, one having a value $C_{cbp}$ between collector and base of the PNP output transistors $T_{op1}$ and $T_{op2}$, and one having a value $C_{cbn}$ between collector and base of the NPN output transistors $T_{on3}$ and $T_{on4}$. All these parasitic capacitances have an effect on the write current through the write terminals 6 and 8. The effect is that at high frequencies the write current flows through the parasitic capacitances instead of through the write head. This effect limits the bit rate of the write current. In order to reduce or even eliminate the adverse effect of the parasitic capacitances four neutralising capacitors 142, 144, 146 and 148 are provided, whose capacitance values are $C_{np}$, $C_{nn}$ and $C_{nn}$, respectively. The capacitor 142 is connected between the first current input terminal 16 and the second current output terminal 26, the second capacitor 144 between the second current input terminal 24 and the first current output terminal 18, the third capacitor 146 between the third current input terminal 32 and the fourth current output terminal 42, and the fourth capacitor 148 between the fourth current input terminal 40 and the third current output terminal.

When it is assumed that the current mirror ratio of the four current mirrors 14, 22, 30 and 38 is M the capacitance value $C_h$ seen between the write terminal 6 and the write terminal 8 will be equal to:

$$C_h = (C_{cwp} + C_{csn} + (1+M)(C_{cbp} + C_{cbn}) + (1-M)(C_{np} + C_{nn}))/2$$

This may be illustrated as follows by determining which currents flow in, for example, the third current output terminal 34 as a result of the capacitors connected to this terminal. If the voltage at the third current output terminal 34 is assumed to be V, the voltage at the fourth current output terminal 42 will be −V. The current i in the third current output terminal 34 is then:

$$i = p*V*C_{csn} + p*V*C_{cbn} + p*V*C_{nn} + M*\{p*V*C_{cbn} - p*V*C_{nn}\} = p*V*\{C_{csn} + (M+1)C_{cbn} - (M-1)C_{nn}\}$$

The current through the capacitor 146 has an opposite sign and is enlarged by the current mirror factor M. A similar calculation applies to the other current output terminals.

With M=5, $C_{cwp} + C_{csn} = 6$ pF and $C_{cbp} + C_{cbn} = 4$ pF $C_h$ will be 15 pF without neutralization and 5 pF with neutralization, assuming that $C_{np} + C_{nn} = 5$ pF. This yields an improvement by a factor of 3. Obviously, it is also possible to neutralise the parasitic capacitance of the write head itself by making the neutralizing capacitors sufficiently large.

We claim:

1. An arrangement for recording an information signal on a magnetic record carrier, comprising: a write head for recording information on the record carrier, and a write amplifier for driving the write head in response to the information signal, the write amplifier comprising: a first write terminal and a second write terminal, coupled to the write head;

a first supply terminal and a second supply terminal for the connection of a supply voltage for the write amplifier;

a first current mirror having a first current input terminal, a first current output terminal coupled to the first write terminal, and a first common current terminal connected to the first supply terminal;

a second current mirror having a second current input terminal, a second current output terminal coupled to the second write terminal, and a second common current terminal connected to the first supply terminal; and current switching means for establishing a current path between the first current output terminal and the second supply terminal via the first write terminal and the second write terminal for a first value of the information signal and for establishing a current path between the second current output terminal and the second supply terminal via the first write terminal and the second write terminal for a second value of the information signal, wherein the current switching means comprise:

a third current mirror having a third current input terminal, a third current output terminal coupled to the first write terminal, and a third common current terminal connected to the second supply terminal;

a fourth current mirror having a fourth current input terminal, a fourth current output terminal coupled to the second write terminal, and a fourth common current terminal connected to the second supply terminal;

a first switchable current source connected between the first current input terminal and the fourth current input terminal for supplying a first current for a first value of the information signal; and a second switchable current source connected between the second current input terminal and the third current input terminal for supplying a second current for the second value of the information signal.

2. An arrangement as claimed in claim 1, wherein the write amplifier further comprises: a first resistor connected between the first write terminal and a first node, a second resistor connected between the first node and the second write terminal, a third resistor connected between the first supply terminal and the first node, and a fourth resistor connected between the second supply terminal and the first node.

3. An arrangement as claimed in claim 1, wherein the write amplifier further comprises: a first resistor connected between the first write terminal and a first node, a second resistor connected between the first node and the second write terminal, a first transistor of a first conductivity type having a control electrode, a first main electrode connected to the first node and a second main electrode coupled to the first supply terminal, a second transistor of the first conductivity type having a control electrode connected to the control electrode of the first transistor, a first main electrode, and a second main electrode connected to the control electrode of the second transistor, a third resistor connected between the first supply terminal and the second main electrode of the second transistor, a third transistor of a second conductivity type having a control electrode, a first main electrode connected to the first node and a second main electrode coupled to the second supply terminal, a fourth transistor of the second conductivity type having a control electrode connected to the control electrode of the third transistor, a first main electrode connected to the first main electrode of the second transistor and a second main electrode connected to the control electrode of the fourth transistor, and a fourth resistor connected between the second supply terminal and the second main electrode of the fourth transistor.

4. An arrangement as claimed in claim 1, wherein the write amplifier further comprises:

a first resistor connected between the first write terminal and a first node, a second resistor connected between the first node and the second write terminal, a third resistor connected between the first write terminal and a second node, a fourth resistor connected between the second node and the second write terminal, a first transistor of a first conductivity type having a control electrode, a first main electrode connected to the first node and a second main electrode coupled to the first current input terminal, a second transistor of the first conductivity type having a control electrode connected to the control electrode of the first transistor, a first main electrode, and a second main electrode connected to the control electrode of the second transistor, a fifth resistor connected between the first supply terminal and the second main electrode of the second transistor, a third transistor of the first conductivity type having a control electrode connected to the control electrode of the first transistor, a first main electrode connected to the second node and a second main electrode coupled to the second current input terminal, a fourth transistor of a second conductivity type having a control electrode, a first main electrode connected to the first node and a second main electrode coupled to one of the third current input terminal and the fourth current input terminal, a fifth transistor of the second conductivity type having a control electrode connected to the control electrode of the fourth transistor, a first main electrode connected to the first main electrode of the second transistor and a second main electrode connected to the control electrode of the fifth transistor, a sixth resistor connected between the second supply terminal and the second main electrode of the fifth transistor, and a sixth transistor of the second conductivity type having a control electrode connected to the control electrode of the fourth transistor, a first main electrode connected to the second node and a second main electrode coupled to the other one of the third current input terminal and the fourth current input terminal.

5. An arrangement as claimed in claim 4, wherein the second node is connected to the first node.

6. An arrangement as claimed in claim 4, wherein the first and the second switchable current source comprise:

a seventh transistor of a first conductivity type having a control electrode connected to a third node, a first main electrode, and a second main electrode coupled to the first current input terminal, an eighth transistor of the first conductivity type having a control electrode connected to the control electrode of the seventh transistor, a first main electrode, and a second main electrode coupled to the first supply terminal, a ninth transistor of a second conductivity type having a control electrode connected to a fourth node, a first main electrode connected to the first main electrode of the seventh transistor, and a second main electrode coupled to the fourth current input terminal, a diode-connected tenth transistor of the second conductivity type having a first main electrode connected to the first main electrode of the eighth transistor and having a control electrode and second main electrode connected to the fourth node, a bias current source coupled to the fourth node to supply a bias current to the fourth node, an eleventh transistor of the first conductivity type having a control electrode connected to a fifth node, a first main electrode, and a second main electrode coupled to the second current input terminal, a twelfth transistor of the first conductivity type having a control electrode connected to the control electrode of the eleventh transistor, a first main electrode, and a second main electrode coupled to the first supply terminal, and a thirteenth transistor of the second conductivity type having a control electrode connected to the fourth node, a first main electrode connected to the first main electrode of the eleventh transistor, and a second main electrode coupled to the second current input terminal.

7. An arrangement as claimed in claim 6, wherein the first and the second switchable current source further comprise:

a fourteenth transistor of the first conductivity type having a control electrode for receiving the information signal, a first main electrode connected to the third node and a second main electrode coupled to the first supply terminal, a fifteenth transistor of the first conductivity type having a control electrode for receiving the information signal, a first main electrode connected to the fifth node and a second main electrode coupled to the first supply terminal, a sixteenth transistor of the first conductivity type having a control electrode connected to the control electrode of the eighth transistor, a first main electrode connected to the first main electrode of the eighth transistor, and a second main electrode coupled to the fifth node, a seventeenth transistor of the first conductivity type having a control electrode connected to the control electrode of the twelfth transistor, a first main electrode connected to the first main electrode of the twelfth transistor, and a second main electrode coupled to the third node, the second main electrode of the eighth transistor being connected to the third node and the second main electrode of the twelfth transistor being connected to the fifth node.

8. An arrangement as claimed in claim 1, wherein the write amplifier further comprises at least one of:

a first capacitor connected between the first current input terminal and the second current output terminal, a second capacitor connected between the second current input terminal and the first current output terminal, a third capacitor connected between the third current input terminal and the fourth current output terminal, and a fourth capacitor connected between the fourth current input terminal and the third current output terminal.

9. An arrangement as claimed in claim 1, wherein the third current mirror and the fourth current mirror each comprise a diode-connected input transistor of a first conductivity type having a control electrode and a second main electrode connected to the third and the fourth current input terminal, respectively, and having a first main electrode coupled to the second supply terminal, and an output transistor of the first conductivity type having a control electrode connected to the control electrode of its respective input transistor, a first main electrode coupled to the second supply terminal, and a second main electrode connected respectively to the third and the fourth current output terminal, and in that the first current mirror and the second current mirror each comprise a diode-connected input transistor of the second conductivity type having a control electrode and a second main electrode connected to the first and the second current input terminal, respectively, and having a first main electrode coupled to the first supply terminal, and an output transistor of the second conductivity type having a control electrode connected to the control electrode of its respective input transistor, a first main electrode coupled to the first supply terminal, and a respective second main electrode connected to the first and the second current output terminal, respectively.

10. An arrangement as claimed in claim 9, wherein the first main electrodes of the input transistors and output transistors of the first and the second current mirror are connected to the first supply terminal via resistors, and the first main electrodes of the input transistors and output transistors of the third and the fourth current mirror are connected to the second supply terminal via respective resistors.

11. A write amplifier for use in an arrangement as claimed in claim 1, for recording an information signal on a magnetic record carrier.

12. An arrangement as claimed in claim 1, wherein the first and the second switchable current source comprise:

a first transistor of a first conductivity type having a control electrode connected to a third node, a first main electrode, and a second main electrode coupled to the first current input terminal, a second transistor of the first conductivity type having a control electrode connected to the control electrode of the first transistor, a first main electrode, and a second main electrode coupled to the first supply terminal, a third transistor of a second conductivity type having a control electrode connected to a fourth node, a first main electrode connected to the first main electrode of the first transistor, and a second main electrode coupled to the fourth current input terminal, a diode-connected fourth transistor of the second conductivity type having a first main electrode and having a control electrode and a second main electrode connected to the fourth node, a bias current source coupled to the fourth node to supply a bias current to the fourth node, a fifth transistor of the first conductivity type having a control electrode connected to a fifth node, a first main electrode, and a second main electrode coupled to the second current input terminal, a sixth transistor of the first conductivity type having a control electrode connected to the control electrode of the fifth transistor, a first main electrode connected to the first main electrodes of the second transistor and the fourth transistor, and a second main electrode coupled to the first supply terminal, and a seventh transistor of the second conductivity type having a control electrode connected to the fourth node, a first main electrode connected to the first main electrode of the fifth transistor, and a second main electrode coupled to the third current input terminal.

13. A write amplifier circuit for a magnetic write head comprising:

first and second write terminals for connection to respective terminals of the write head, first and second supply voltage terminals for the write amplifier circuit, first, second, third and fourth current mirrors each having a current input terminal, a current output terminal and a common terminal, first means coupling the common terminals of the first and second current mirrors to the first supply voltage terminal and the common terminals of the third and fourth current mirrors to the second supply voltage terminal, second means coupling the output terminals of the first and third current mirrors to the first write terminal and the output terminals of the second and fourth current mirrors to the second write terminal, a first switchable current source connected between the first current input terminals of the first and fourth current mirrors to provide a first current path that bypasses a write head when connected to said first and second write terminals, and a second switchable current source connected between the first input terminals of the second and third current mirrors to provide a second current path that bypasses a write head when connected to said first and second write terminals.

14. The write amplifier circuit as claimed in claim 13 wherein said first and second switchable current sources comprise switchable floating current sources and the output terminals of the current mirrors produce a high impedance at the first and second write terminals.

* * * * *

Disclaimer

5,668,676—Johannes O. Voorman; Hendrik J. Pothast; Ho W. Wong-Lam, all of Eindhoven, Netherlands. MAGNETIC HEAD WRITE AMPLIFIER INCLUDING CURRENT MIRRORS AND SWITCHABLE CURRENT SOURCES. Patent dated September 16, 1997. Disclaimer filed June 24, 2008, by the assignee, U.S. Philips Corporation.

Hereby disclaims all of the claims of said patent.

(*Official Gazette September 30, 2008*)